United States Patent
Lim et al.

(10) Patent No.: US 7,214,590 B2
(45) Date of Patent: May 8, 2007

(54) METHOD OF FORMING AN ELECTRONIC DEVICE

(75) Inventors: Sangwoo Lim, Austin, TX (US); Paul A. Grudowski, Austin, TX (US); Mohamad M. Jahanbani, Austin, TX (US); Hsing H. Tseng, Austin, TX (US); Choh-Fei Yeap, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 116 days.

(21) Appl. No.: 11/098,874

(22) Filed: Apr. 5, 2005

(65) Prior Publication Data

US 2006/0223266 A1   Oct. 5, 2006

(51) Int. Cl.
*H01L 21/336* (2006.01)

(52) U.S. Cl. .................. 438/287; 438/585; 438/591

(58) Field of Classification Search ............. 438/287, 438/585, 591
See application file for complete search history.

(56) References Cited

U.S. PATENT DOCUMENTS

| | | | |
|---|---|---|---|
| 5,149,664 A | 9/1992 | Shin et al. | |
| 5,432,114 A * | 7/1995 | O | 438/217 |
| 5,712,177 A | 1/1998 | Kaushik et al. | |
| 5,973,358 A | 10/1999 | Kishi | |
| 6,335,262 B1 | 1/2002 | Crowder et al. | |
| 6,413,826 B2 | 7/2002 | Kim | |
| 6,504,214 B1 | 1/2003 | Yu et al. | |
| 6,551,884 B2 * | 4/2003 | Masuoka | 438/275 |
| 6,586,293 B1 * | 7/2003 | Hasegawa | 438/216 |
| 6,638,819 B1 | 10/2003 | Joshi et al. | |
| 6,642,105 B2 | 11/2003 | Kim et al. | |
| 6,709,932 B1 | 3/2004 | Krishnan et al. | |
| 6,717,226 B2 | 4/2004 | Hegde et al. | |
| 6,797,572 B1 | 9/2004 | Jeon et al. | |
| 2003/0199133 A1 * | 10/2003 | Rodder et al. | 438/200 |
| 2004/0032001 A1 * | 2/2004 | Gilmer et al. | 257/500 |
| 2005/0023604 A1 * | 2/2005 | Kim et al. | 257/316 |
| 2005/0079674 A1 * | 4/2005 | Zheng et al. | 438/258 |

* cited by examiner

Primary Examiner—Trung Dang

(57) ABSTRACT

A method of forming an electronic device includes etching a portion of a first gate dielectric layer to reduce a thickness of the gate dielectric layer within that portion. In one embodiment, portions not being etched may be covered by mask. In another embodiment, different portions may be etched during different times to give different thicknesses for the first gate dielectric layer. In a particular embodiment, a second gate dielectric layer may be formed over the first gate dielectric layer after etching the portion. The second gate dielectric layer can have a dielectric constant greater than the dielectric constant of the first gate dielectric layer. Subsequent gate electrode and source/drain region formation can be performed to form a transistor structure.

20 Claims, 3 Drawing Sheets

METHOD OF FORMING AN ELECTRONIC DEVICE

BACKGROUND

1. Field of the Disclosure

This invention relates generally to electronic devices, particularly electronic devices having gate dielectric layers that are partially etched.

2. Description of the Related Art

Electronic components in electronic devices continue to decrease in size, while the density of components increases. In particular, the processing requirements for forming such electronic devices is becoming more involved. Electronic devices have transistors and each type of transistor may include different gate dielectric layers. The type of gate dielectric layer may be determined by calculating the necessary capacitance of a region. Varying the thickness of the gate dielectric layer, varying the type of gate dielectric material, or combination thereof is a typical method of controlling the capacitance of a region.

Typically, when forming electronic components, particularly gate structures, a form-mask-etch process sequence is repeated for gate dielectric layers. The effect of the form-mask-etch process is to effectively form different gate dielectric layers of different thicknesses where each gate dielectric layer is separately formed during differential growth or deposition cycles. However, the repetition of the process exposes the substrate surface to chemicals that roughen the surface of the substrate.

The surface roughening of the substrate, which can result from the repetitious form-mask-etch process sequence may cause locations of high electrical field and non-uniform gate dielectric thickness. The effect of which is increased likelihood that the electronic device will have a region of failure and degradation of the overall device. Moreover, processes that require many forming steps are more expensive and increase manufacturing costs of the device. Therefore, the longer and the more involved the process, the more likely the processing will degrade the components quality while increasing the prices to manufacture.

BRIEF DESCRIPTION OF THE DRAWINGS

The present disclosure may be better understood, and its numerous features and advantages made apparent to those skilled in the art by referencing the accompanying drawings.

Figure 1:
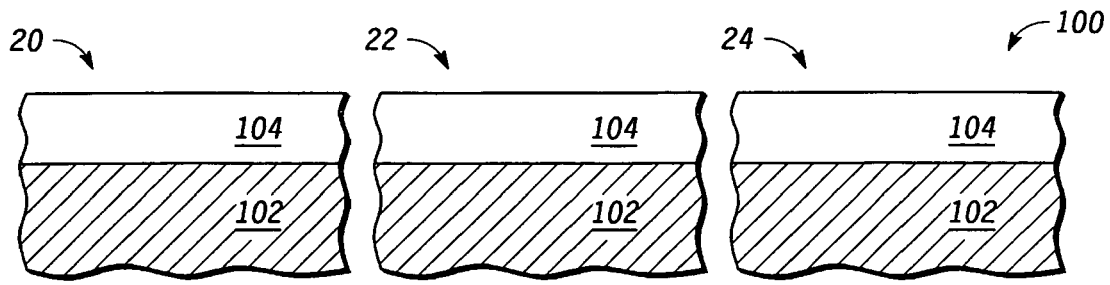
FIG. 1 includes an illustration of a cross-sectional view of regions of a substrate after forming a gate dielectric layer.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments.

DETAILED DESCRIPTION

A method of forming an electronic device includes etching a portion of a first gate dielectric layer to reduce a thickness of the gate dielectric layer within that portion. In one embodiment, portions not being etched may be covered by mask. In another embodiment, different portions may be etched during different times to give different thicknesses for the first gate dielectric layer. In a particular embodiment, a second gate dielectric layer may be formed over the first gate dielectric layer after etching the portion. The second gate dielectric layer can have a dielectric constant greater than the dielectric constant of the first gate dielectric layer. Subsequent gate electrode and source/drain region formation can be performed to form a transistor structure.

In a first aspect, a method of forming an electronic device can include forming a first gate dielectric layer over a substrate, etching a first portion of the first gate dielectric layer to reduce a thickness of the first portion, and etching a second portion of the first gate dielectric layer to reduce a thickness of the second portion, wherein a thickness of the second portion is different than a thickness for the first portion.

In one embodiment, the method can include forming a second gate dielectric layer over the first portion and the second portion, the second gate dielectric layer having a dielectric constant greater than the dielectric constant of the first gate dielectric layer. In another embodiment, the method can also include masking the first gate dielectric layer before etching the second portion of the gate dielectric layer.

In another embodiment of the first aspect, the first gate dielectric layer can include a material selected from the group consisting of $SiO_2$, $Si_3N_4$, $Si_aO_bN_c$, and all combinations thereof, wherein a sum of a, b, and c is 1. In another embodiment, the first gate dielectric layer can include a material having a high dielectric constant. Still, another embodiment can include forming the first gate dielectric layer by plasma depositing an oxynitride layer.

In another embodiment of the first aspect, etching is performed using a HF solution, wherein the HF solution can include approximately 100 parts water per 1 part HF. Another embodiment includes forming a first gate electrode over the first portion and a second gate electrode over the second portion. Also, an embodiment can include the first portion being an I/O region, and the second portion being a logic region.

In a second aspect, a method of forming an electronic device can include forming a gate dielectric layer over a substrate, forming a first mask over the gate dielectric layer, the mask defining a first portion and a second portion of the gate dielectric layer, wherein the first portion is an unexposed portion and the second portion is an exposed portion. The method can also include etching the exposed portion of the gate dielectric layer to reduce a thickness of the exposed portion, removing the mask, and forming gate electrodes over the first and second portions.

In one embodiment of the second aspect, the method can further include forming a second mask over the gate dielectric layer. The mask defines a third and fourth portion of the gate dielectric layer. The third portion is an unexposed portion, and the fourth portion is an exposed portion, then etching the exposed second portion of the gate dielectric layer to reduce a thickness of the gate dielectric layer, and removing the mask.

In another embodiment of the second aspect, the method can further include forming a sacrificial layer over the substrate, implanting ions through the sacrificial layer and into the substrate, and removing the sacrificial layer before forming the gate dielectric layer. In still another embodiment, the first portion is an I/O region, and the second portion is a logic region.

In another embodiment of the second aspect the gate dielectric layer can include a material selected from the group consisting of $SiO_2$, $Si_3N_4$, $Si_aO_bN_c$, and all combinations thereof, wherein a sum of a, b, and c is 1. In another embodiment, the gate dielectric layer comprises a material having a high dielectric constant.

In a third aspect, a method of forming an electronic device includes forming a sacrificial layer over a substrate, implanting ions through the sacrificial layer and into the substrate, and removing the sacrificial oxide layer. The method further includes forming a first gate dielectric layer over the substrate, and forming a first mask over the first gate dielectric layer, defining a first portion and a second portion of the first gate dielectric layer. The first portion is an unexposed portion and the second portion is an exposed portion. The method further includes etching the second portion of the first gate dielectric layer to reduce a thickness of the exposed portion, removing the first mask, and forming a second mask over the first gate dielectric layer, defining a third and fourth portion of the first gate dielectric layer. The third portion is an unexposed portion and the fourth portion is an exposed portion. The method further includes etching the first portion of the first gate dielectric layer to reduce a thickness of the exposed portion and removing the second mask. The method further includes forming a second gate dielectric layer after etching the first and second portions of the first gate dielectric layer and forming a first gate electrode over the first portion of the first gate dielectric layer and a second gate electrode on the second portion of the gate dielectric layer.

In one embodiment of the third aspect, the method can further include forming an extension region within the substrate after forming the first and second gate electrodes. In another embodiment, the method can further include forming source/drains within the substrate. Further, in another embodiment, the first portion is an I/O region, and the second portion is a logic region.

Before addressing details of embodiments described below, some terms are defined or clarified. Group numbers corresponding to columns within the Periodic Table of the elements use the "New Notation" convention as seen in the CRC Handbook of Chemistry and Physics, 81$^{st}$ Edition (2000).

"High dielectric constant" is intended to mean a layer or material that has a dielectric constant greater than 8.0.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Unless otherwise defined, all technical and scientific terms used herein have the same meaning as commonly understood by one of ordinary skill in the art to which this invention belongs. All publications, patent applications, patents, and other references mentioned herein are incorporated by reference in their entirety. In case of conflict, the present specification, including definitions, will control. In addition, the materials, methods, and examples are illustrative only and not intended to be limiting.

FIG. 1 includes illustrations of regions of a substrate 102 within an electronic device 100 (e.g., an integrated circuit) after forming an original gate dielectric layer 104 over the substrate 102. The substrate 102 can include a monocrystalline semiconductor wafer, or other substrates conventionally used to form electronic devices. Enumerated regions 20, 22 and 24 may contain different electronic components. For example, high-voltage ("HV") components may be formed within an HV region 20, logic components may be formed within a logic region 22, and input/output ("I/O") components may be formed within an I/O region 24. The maximum designed voltage across the gate dielectric layer within the HV components will be higher than the maximum designed voltage across the gate dielectric layer within the I/O or logic components. Likewise, the maximum designed voltage across the gate dielectric layer within the I/O components will be higher than the maximum designed voltage across the gate dielectric layer within the logic components.

An original gate dielectric layer 104 is formed over the substrate 102, including the HV region 20, the logic region 22, and the I/O region 24, as illustrated in FIG. 1. The original gate dielectric layer 104 can be formed by a thermal growing processes using an ambient including steam, oxygen, other oxidizing species, or any combination thereof or by depositing the gate dielectric layer using a conventional chemical vapor deposition technique, physical vapor deposition technique, atomic layer deposition technique, or a combination thereof.

In one embodiment, the original gate dielectric layer 104 can include, $SiO_2$, $Si_3N_4$, $Si_aO_bN_c$, or any combination thereof. In another embodiment, the original gate dielectric layer 104 can include $Hf_aO_bN_c$, $Hf_aSi_bO_c$, $Hf_aSi_bO_cN_d$, $Hf_aZr_bO_cN_d$, $Hf_aZr_bSi_cO_dN_e$, $Hf_aZr_bO_c$, $Zr_aSi_bO_c$, $Zr_aSi_bO_cZr_aSi_bO_cN_d$, $ZrO_2$ other Hf-containing or Zr-containing dielectric material, a doped version of any of the foregoing (lanthanum doped, niobium doped, etc.), other suitable high-k material, or any combination thereof. As used throughout this specification, the sum of the lettered subscripts for any specific compound is 1. In one embodiment, the original gate dielectric layer 104 is formed by plasma deposition of an oxynitride layer. The original gate dielectric layer 104 has a thickness in a range of approximately 10 to 50 nm.

Figure 2:
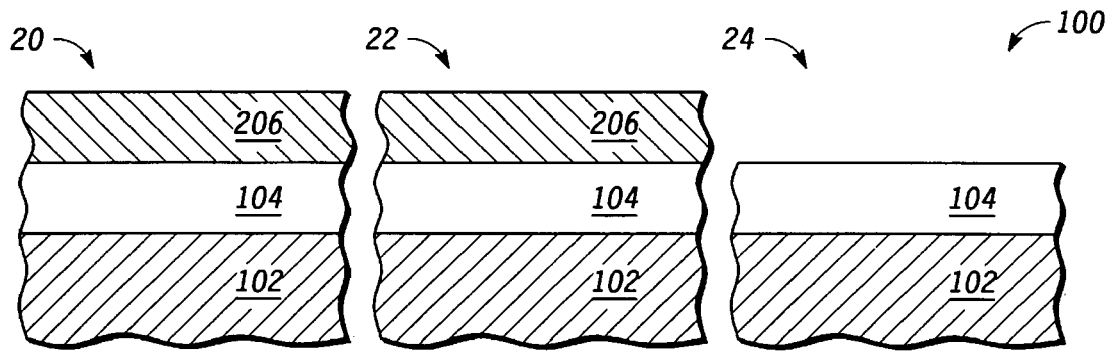
FIG. 2 includes an illustration of a cross-sectional view of the regions of FIG. 1 after masking at least one of the regions.

A first mask 206 is formed over the original gate dielectric layer 104 within the HV region 20 and logic region 22, leaving the original gate dielectric layer 104 within the I/O region 24 exposed, as illustrated in FIG. 2. The first mask 206 can include a conventional resist material. The conventional resist material may be patterned using a conventional lithographic technique. At this point in the process, portions of the original gate dielectric layer 104 covered by the first mask 206 are protected or unexposed portions of the original gate dielectric layer 104 and portions of the original gate dielectric layer 104 not covered by the first mask 206 are exposed portions of the original gate dielectric layer 104. The exposed portions of the original gate dielectric layer 104 are etched isotropically or anisotropically, as a wet etch or dry etch, or any combination of the foregoing. In one embodiment, a wet etch solution is used to reduce a thickness of the original gate dielectric layer 104. In one embodiment, the wet etch solution is a dilute HF solution (e.g. at least approximately 100 parts $H_2O$ per part HF). In another embodiment, the original gate dielectric layer 104 includes a silicon nitride or silicon oxynitride, which may require the use of a different wet etch solution. When the original gate dielectric layer 104 is silicon nitride, the wet etch solution may include $H_3PO_4$. For other materials, HF can be used as an oxide etchant, and $H_3PO_4$ can be used as a nitride etchant. The first mask 206 can be removed using a conventional ashing technique.

Figure 3:
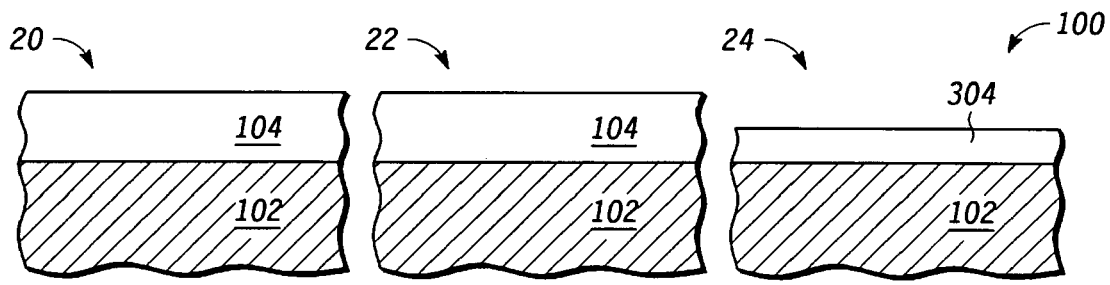
FIG. 3 includes an illustration of a cross-sectional view of the regions of FIG. 2 after etching exposed regions and removing the masking.
Figure 4:
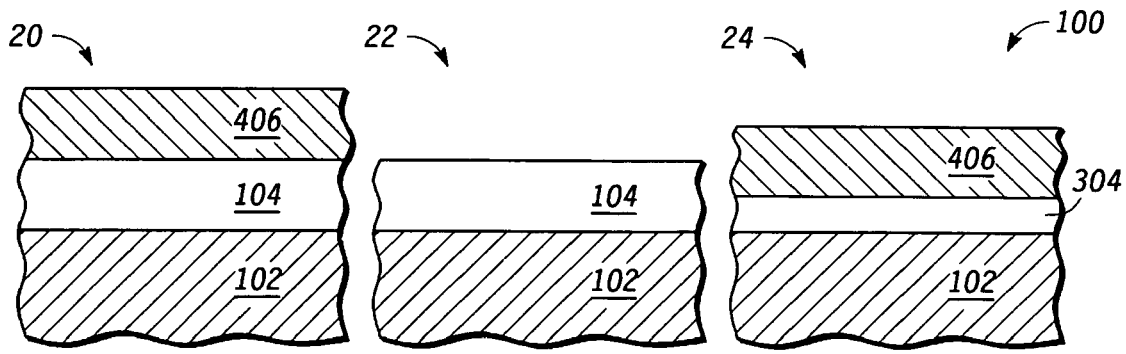
FIG. 4 includes an illustration of a cross-sectional view of the regions of FIG. 3 after masking at least one of the regions.
Figure 5:
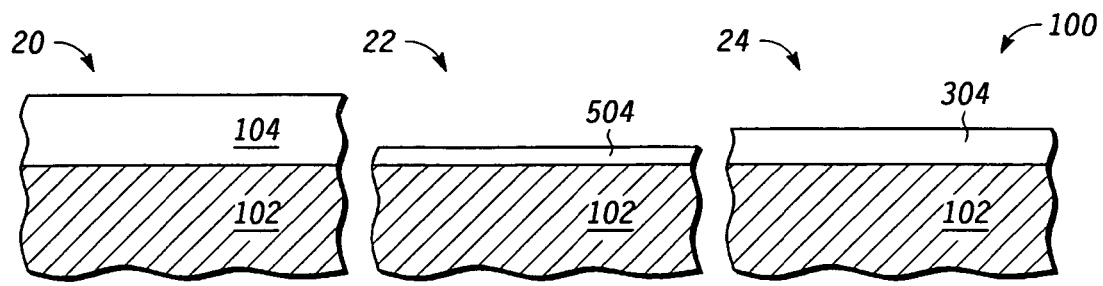
FIG. 5 includes an illustration of a cross-sectional view of the regions of FIG. 4 after etching exposed regions and removing the masking.

After etching the exposed portions of the original gate dielectric layer 104 within the I/O region 24 the first mask 206 is removed from the unexposed HV region 20 and logic region 22, as illustrated in FIG. 3. In one embodiment, the original gate dielectric layer 104 within the I/O region 24 is etched to form a first reduced thickness gate dielectric layer 304, which is thinner than the original gate dielectric layer 104 in the HV region 20 and the logic region 22. The reduced thickness gate dielectric layer 304 has a thickness in a range of approximately 10 to 40 nm A second mask 406 is formed over the original gate dielectric layer 104 within the HV region 20 and the first reduced thickness gate dielectric layer 304 within the I/0 region 24 as illustrated in FIG. 4. The second mask 406 can include a conventional resist material. The conventional resist material may be patterned using a conventional lithographic technique. Unexposed or protected portions are covered by the second mask 406, and exposed portions are not covered by the second mask 406. Exposed portions of the original gate dielectric layer 104, such as within the logic region 22 are etched to form a second reduced thickness of the gate dielectric layer 504, as illustrated in FIG. 5. The second reduced thickness of the gate dielectric layer 504 has a thickness in a range of approximately 2 to 20 nm. The etch can be performed using any one or more technique as described with respect to forming the first reduced gate dielectric layer 304. The etching when forming the first and second reduced thickness gate dielectric layer 304 and 504 may be the same or different compared to each other.

FIG. 5 illustrates the cross-sectional views of the regions of FIG. 4 after etching exposed regions and removing the second mask 406. In this embodiment, the thicknesses of the original gate dielectric layer 104, the first reduced thickness gate dielectric layer 304 and the second reduced gate dielectric layer 504 are different from one another. The original gate dielectric layer 104 within the HV region 20 maintains substantially the original thickness of the original gate dielectric layer 104 as formed, while the second reduced thickness of the gate dielectric layer 504 within the logic region 22 has the least amount of the original gate dielectric layer 104 remaining. The first reduced thickness of the gate dielectric layer 304 within the I/O region 24 has a thickness between the thickness of the original gate dielectric layer 104 within the HV region 20 and the second reduced thickness of the gate dielectric layer 504 within the logic region 24. The variable thickness in each of the three regions is accomplished using mask and etch processes with no additional growth or deposition processes after forming of the original gate dielectric layer 104.

Figure 6:
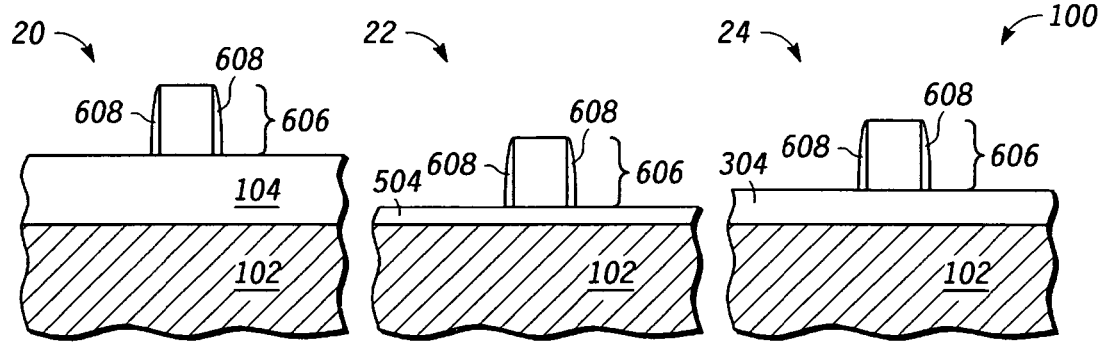
FIG. 6 includes an illustration of a cross-sectional view of the regions of FIG. 5 after forming gate electrodes.

In one embodiment, gate electrodes 606 are formed over the HV region 20, logic region 22 and the I/O region 24, as illustrated in FIG. 6. The gate electrodes 606 can be formed by depositing a conductive layer, including polysilicon, amorphous silicon, a metal-containing material (e.g. a metal nitride or metal carbide), other suitable material, or any combination thereof, and patterning the conductive layer using conventional techniques. FIG. 6 also illustrates sets of spacers 608 along the sides of the gate electrodes 606. The set of spacers 608 can be formed by depositing an insulating layer (e.g., an oxide, a nitride, an oxynitride, or a combination thereof) over the substrate 102 and anisotropically etching the insulating layer. In one embodiment, each of the spacers 608 has a generally parabolic (curved) outer surface, and the width of the spacers 608 at their base is no more than approximately 15 nm. The set of spacers 608 are formed along vertical or near vertical surfaces of the gate electrodes 606.

Figure 7:
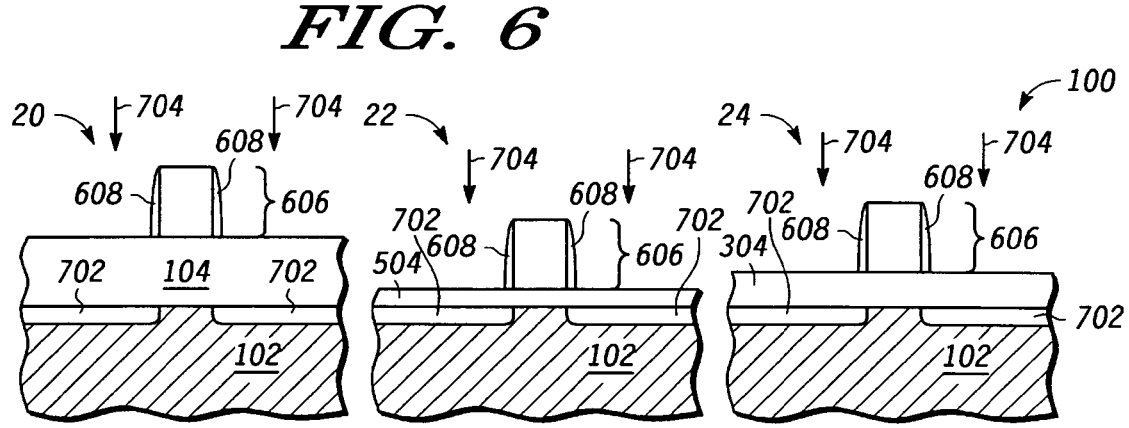
FIG. 7 includes an illustration of a cross-sectional view of the regions of FIG. 6 after doping portions within the substrate.

Extensions regions 702 are formed in the substrate 102 in an elevation below the gate electrode 606. In one embodiment, extension regions 702 are formed by ion implanting a p-type dopant (e.g., boron) or an n-type dopant (e.g., phosphorus or arsenic) (illustrated as arrows 704 in FIG. 7).

Figure 8:
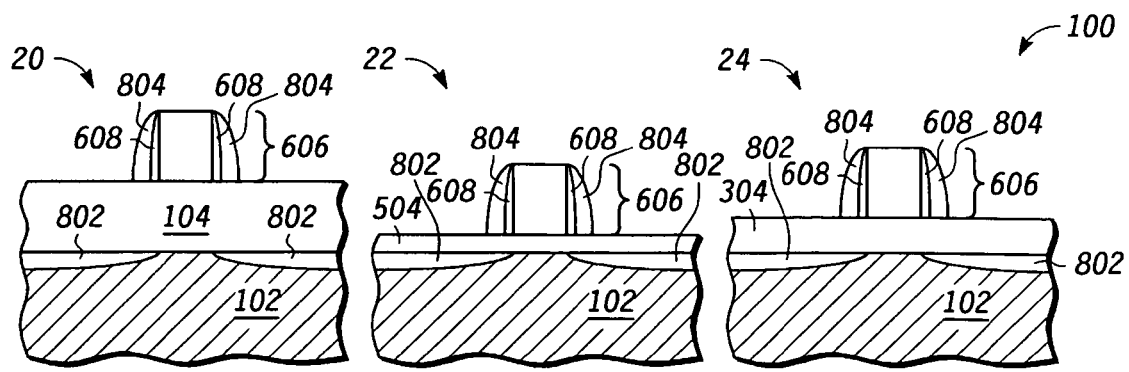
FIG. 8 includes an illustration of a cross-sectional view of the regions of FIG. 7 after the annealing the substrate to form source/drains within the substrate.

A second set of spacers 804 are formed along the sides of the spacers 608, as illustrated in FIG. 8. The set of spacers 804 can be formed by depositing an insulating layer (e.g., an oxide, a nitride, or an oxynitride or a combination thereof) over the substrate 102 and anisotropically etching. In one embodiment, each of the spacers 804 have a generally parabolic (curved) outer surface, and the width of the second set of spacers 804 at their base is no more than approximately 50 nm. The second set of spacers 804 are formed along outer surfaces of the spacers 608.

Heavily doped regions are formed in the substrate 102 in an elevation below the gate electrode 606 in a substantially same region as the extension regions 702. In one embodiment, the heavily doped regions are formed by ion implanting a p-type dopant (e.g., boron) or an n-type dopant (e.g., phosphorus or arsenic) (illustrated as arrows 704 in FIG. 7).

A thermal anneal process activates the dopants from the extension doping and heavy doping to form the source/ drains regions 802, as illustrated in FIG. 8. The source/drain regions 802 include the extension regions 702 and extend partly under the gate electrodes 606. The source/drain regions 802 are used with the transistors within the HV region 20, logic region 22, and I/O region 24.

Figure 9:
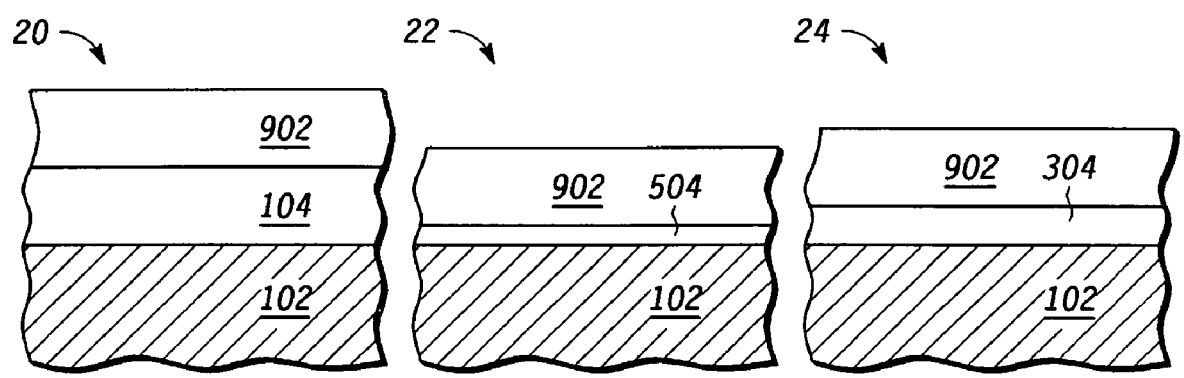
FIG. 9 includes an illustration of a cross-sectional view of the regions of FIG. 5 after forming a second gate dielectric layer.

In one alternative embodiment, a second gate dielectric layer 902 is formed over all regions of the substrate 102 as illustrated in FIG. 9. The second gate dielectric layer 902 can include a material having a higher dielectric constant than the original gate dielectric layer 104 and can have a thickness in a range of approximately 2 nm to 20 nm. The second gate dielectric layer 902 may include one or more materials as previously described. The second gate dielectric layer 902 can be formed by depositing the second dielectric layer 902 using a conventional chemical vapor deposition technique, physical vapor deposition technique, atomic layer deposition technique, or a combination thereof. In one embodiment, the second gate dielectric layer 902 is formed by plasma deposition of a nitride layer. After the formation of the second gate dielectric layer 902, the process can continue starting with the formation of the gate electrodes 606 as previously described.

In another alternative embodiment (not illustrated), a sacrificial layer may be formed over the substrate 102 before forming the original gate dielectric layer 104. The sacrificial layer protects the substrate during processing, such as implanting ions through the sacrificial layer into the substrate when forming well regions or adjusting the threshold voltages of transistors being formed. The sacrificial layer is subsequently removed. The sacrificial layer can include an oxide, nitride, oxynitride or any combination thereof. The sacrificial layer can be formed and subsequently removed using conventional techniques.

The process of forming an original gate dielectric layer 104 and the reduced thickness gate dielectric layers 304 and 504, can be performed by growing or depositing one layer or a set of layers without subsequently forming another gate dielectric layer. Such processing reduces the contact the substrate 102 has with etching solutions, thereby reducing the potential for damage to the surface of the substrate 102 in the final electronic device. By reducing the number of gate dielectric layer forming processes the cost of the process is reduced.

Note that not all of the activities described above in the general description or the examples are required, that a portion of a specific activity may not be required, and that one or more further activities may be performed in addition to those described. Still further, the order in which activities are listed are not necessarily the order in which they are performed. After reading this specification, skilled artisans will be capable of determining what activities can be used for their specific needs or desires.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

In the foregoing specification, principles of the invention have been described above in connection with specific embodiments. However, one of ordinary skill in the art appreciates that one or more modifications or one or more other changes can be made to any one or more of the embodiments without departing from the scope of the invention as set forth in the claims below. Accordingly, the specification and figures are to be regarded in an illustrative rather than a restrictive sense and any and all such modifications and other changes are intended to be included within the scope of invention.

What is claimed is:

1. A method of forming an electronic device comprising:
   forming a first gate dielectric layer over a substrate;
   etching a first portion of the first gate dielectric layer to reduce a thickness of the first gate dielectric layer to form a first remaining portion of the first gate dielectric layer, wherein the first remaining portion overlies the substrate; and
   etching a second portion of the first gate dielectric layer to reduce a thickness of the first gate dielectric layer to form a second remaining portion of the first gate dielectric layer, wherein the second remaining portion overlies the substrate, and wherein a thickness of the second remaining portion is different than a thickness for the first remaining portion.

2. The method of claim 1, further comprising forming a second gate dielectric layer over the first remaining portion and the second remaining portion, the second gate dielectric layer having a dielectric constant greater than a dielectric constant of the first gate dielectric layer.

3. The method of claim 1, further comprises masking the first gate dielectric layer before etching the second portion of the first gate dielectric layer.

4. The method of claim 1, wherein the first gate dielectric layer comprises a material selected from the group consisting of $SiO_2$, $Si_3N_4$, $Si_aO_bN_c$, and all combinations thereof, wherein a sum of a, b, and c is 1.

5. The method of claim 1, wherein the first gate dielectric layer comprises a material having a high dielectric constant.

6. The method of claim 1, wherein forming the first gate dielectric layer comprises plasma depositing an oxynitride layer.

7. The method of claim 1, wherein etching is performed using a HF solution.

8. The method of claim 7, wherein the HF solution comprises at least approximately 100 parts water per 1 part HF.

9. The method of claim 1, further comprising forming a first gate electrode over the first portion and a second gate electrode over the second portion.

10. The method of claim 1, wherein the first portion is an I/O region, and the second portion is a logic region.

11. A method of forming an electronic device comprising:
    forming a gate dielectric layer over a substrate;
    forming a first mask over the gate dielectric layer, wherein the first mask defines a first portion and a second portion of the gate dielectric layer, and wherein the first portion is an unexposed portion and the second portion is an exposed portion;
    etching the second portion of the gate dielectric layer to reduce a thickness of the gate dielectric layer to form a second remaining portion of the gate dielectric layer, wherein the second remaining portion overlies the substrate;
    removing the first mask;
    forming a second mask over the gate dielectric layer, wherein the second mask defines a third portion and a fourth portion of the gate dielectric layer, wherein the third portion is an unexposed portion and the fourth portion is an exposed portion;
    etching the fourth portion of the gate dielectric layer to reduce a thickness of the gate dielectric layer to form a fourth remaining portion of the gate dielectric layer, wherein the fourth remaining portion overlies the substrate; and
    removing the second mask.

12. The method of claim 11, further comprising forming gate electrodes over the first portion, the second remaining portion, and the fourth remaining portion of the gate dielectric layer.

13. The method of claim 11, further comprising:
    forming a sacrificial layer over the substrate;
    implanting ions through the sacrificial layer and into the substrate; and
    removing the sacrificial layer before forming the gate dielectric layer.

14. The method of claim 11, wherein the gate dielectric layer comprises a material selected from the group consisting of $SiO_2$, $Si_3N_4$, $Si_aO_bN_c$, and all combinations thereof, wherein a sum of a, b, and c is 1.

15. The method of claim 11, wherein the gate dielectric layer comprises a material having a high dielectric constant.

16. The method of claim 11, wherein the first portion is a logic region, and the second portion is an I/O region.

17. A method of forming an electronic device comprising:
forming a sacrificial layer over a substrate;
implanting ions through the sacrificial layer and into the substrate;
removing the sacrificial layer;
forming a first gate dielectric layer over the substrate;
forming a first mask over the first gate dielectric layer, defining a first portion and a second portion of the first gate dielectric layer, wherein the first portion is an unexposed portion and the second portion is an exposed portion;
etching the second portion of the first gate dielectric layer to reduce a thickness of the exposed portion to form a second remaining portion of the gate dielectric layer, wherein the second remaining portion overlies the substrate;
removing the first mask;
forming a second mask over the first gate dielectric layer, defining a third portion and a fourth portion of the first gate dielectric layer, wherein the third portion is an unexposed portion and the fourth portion is an exposed portion;
etching the fourth portion of the first gate dielectric layer to reduce a thickness of the exposed portion to form a fourth remaining portion of the gate dielectric layer, wherein the fourth remaining portion overlies the substrate;
removing the second mask;
forming a second gate dielectric layer after etching the second and fourth portions of the first gate dielectric layer; and
forming a first gate electrode, a second gate electrode, and a third gate
electrode, wherein:
the first gate electrode overlies the first portion of the first gate dielectric layer;
the second gate electrode overlies the second remaining portion of the first gate dielectric layer; and
the third gate electrode overlies the fourth remaining portion of the first gate dielectric layer.

18. The method of claim 17, wherein the first position and the third portion are a same portion of the first gate dielectric layer.

19. The method of claim 17, further comprising forming source/drains within the substrate.

20. The method of claim 17, wherein the first portion is a logic region, and the second portion is an I/O region.

* * * * *

UNITED STATES PATENT AND TRADEMARK OFFICE
CERTIFICATE OF CORRECTION

PATENT NO. : 7,214,590 B2
APPLICATION NO. : 11/098874
DATED : May 8, 2007
INVENTOR(S) : Sangwoo Lim et al.

It is certified that error appears in the above-identified patent and that said Letters Patent is hereby corrected as shown below:

Column No. 10, Line No. 20, change "position" to --portion--

Signed and Sealed this

Twenty-first Day of August, 2007

JON W. DUDAS
*Director of the United States Patent and Trademark Office*